(12) United States Patent
Lim et al.

(10) Patent No.: US 12,283,616 B2
(45) Date of Patent: Apr. 22, 2025

(54) FinFET HAVING A WORK FUNCTION MATERIAL GRADIENT

(71) Applicant: TAIWAN SEMICONDUCTOR MANUFACTURING CO., LTD., Hsinchu (TW)

(72) Inventors: Peng-Soon Lim, Johor (MY); Zi-Wei Fang, Hsinchu County (TW); Cheng-Ming Lin, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 343 days.

(21) Appl. No.: 17/700,424

(22) Filed: Mar. 21, 2022

(65) Prior Publication Data
US 2022/0216318 A1    Jul. 7, 2022

Related U.S. Application Data

(62) Division of application No. 16/031,859, filed on Jul. 10, 2018, now Pat. No. 11,282,933.

(60) Provisional application No. 62/593,118, filed on Nov. 30, 2017.

(51) Int. Cl.
| H01L 29/423 | (2006.01) |
|---|---|
| H01L 21/28 | (2006.01) |
| H01L 29/06 | (2006.01) |
| H01L 29/10 | (2006.01) |
| H01L 29/49 | (2006.01) |
| H01L 29/66 | (2006.01) |
| H01L 29/78 | (2006.01) |

(52) U.S. Cl.
CPC .. *H01L 29/42372* (2013.01); *H01L 21/28088* (2013.01); *H01L 21/28097* (2013.01); *H01L 29/0649* (2013.01); *H01L 29/1033* (2013.01); *H01L 29/4966* (2013.01); *H01L 29/66545* (2013.01); *H01L 29/66795* (2013.01); *H01L 29/6681* (2013.01); *H01L 29/785* (2013.01); *H01L 29/7853* (2013.01)

(58) Field of Classification Search
CPC ......... H01L 21/28088; H01L 21/28097; H01L 29/0649; H01L 29/1033; H01L 29/42372; H01L 29/4966; H01L 29/66545; H01L 29/6681; H01L 29/785
See application file for complete search history.

(56) References Cited

U.S. PATENT DOCUMENTS

| 9,012,319 | B1 | 4/2015 | Choi et al. |
| 9,589,806 | B1 * | 3/2017 | Bao ........................ H01L 21/283 |
| 9,620,610 | B1 | 4/2017 | Jangjian et al. |

(Continued)

*Primary Examiner* — Herve-Louis Y Assouman
*Assistant Examiner* — Christopher M Roland
(74) *Attorney, Agent, or Firm* — Maschoff Brennan

(57) ABSTRACT

A method includes forming a semiconductor fin; forming a gate dielectric layer over the semiconductor fin; depositing a first work function metal layer over the gate dielectric layer, the first work function metal layer having a first concentration of a work function material; depositing a second work function metal layer over the first work function metal layer, the second work function metal layer having a second concentration of the work function material, wherein the first concentration is higher than the second concentration; and forming a gate electrode over the second work function metal layer.

20 Claims, 17 Drawing Sheets

(56) References Cited

U.S. PATENT DOCUMENTS

| | | | |
|---|---|---|---|
| 10,043,811 B1 | 8/2018 | Tsai et al. | |
| 2007/0075351 A1* | 4/2007 | Schulz | H01L 27/1211 |
| | | | 257/E21.639 |
| 2014/0070307 A1 | 3/2014 | Ando et al. | |
| 2015/0028430 A1 | 1/2015 | Lee et al. | |
| 2016/0276224 A1 | 9/2016 | Gan et al. | |
| 2016/0379982 A1* | 12/2016 | You | H01L 29/0657 |
| | | | 257/369 |
| 2017/0213770 A1 | 7/2017 | Jangjian et al. | |
| 2018/0082908 A1 | 3/2018 | Yeh et al. | |
| 2018/0138045 A1 | 5/2018 | Xu | |
| 2019/0043979 A1 | 2/2019 | Liu et al. | |

* cited by examiner

170a
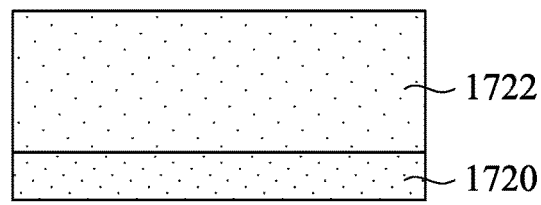
Fig. 20A
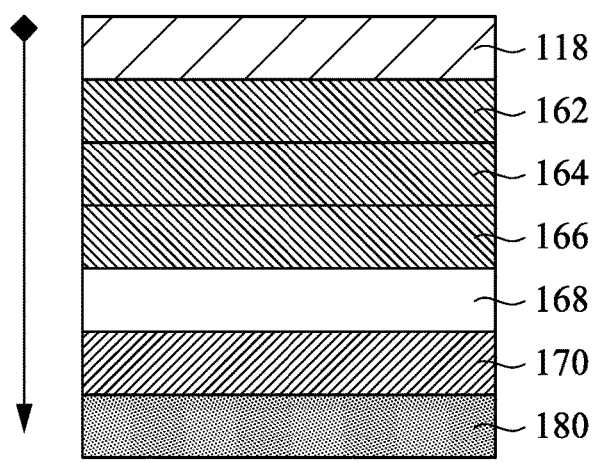
Fig. 19
170b
Fig. 20B
170c
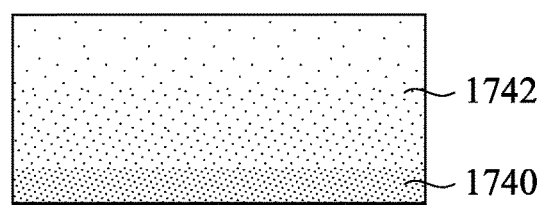
Fig. 20C

FinFET HAVING A WORK FUNCTION MATERIAL GRADIENT

CROSS-REFERENCE TO RELATED APPLICATION

The present application is a Divisional application of U.S. application Ser. No. 16/031,859, filed on Jul. 10, 2018, now U.S. Pat. No. 11,282,933, issued on Mar. 22, 2022, which claims priority to U.S. Provisional Application Ser. No. 62/593,118, filed Nov. 30, 2017, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, other developments in IC processing and manufacturing are needed.

One advancement implemented to realize the smaller feature size is the use of multigate devices such as fin field effect transistor (finFET) devices. FinFETs are so called because a gate is formed on and around a "fin" that extends from the substrate. As the term is implemented in the present disclosure, a finFET device is any fin-based, multi-gate transistor. FinFET devices may allow for shrinking the gate width of device while providing a gate on the sides and/or top of the fin including the channel region. Another advancement implemented as technology nodes shrink, in some IC designs, has been the replacement of the typically polysilicon gate electrode with a metal gate electrode to improve device performance with the decreased feature sizes. Work function metal layers are used to ensure stability of metal gate electrode current and work function value. However, the shrinking device scale does not allow much space to the work function metal layer, and voltage fluctuation may occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 illustrates a schematic view of different layers along the arrow of FIG. 16A;

FIGS. 20A through 20C illustrate cross-sectional views of work function metal layers in accordance with some embodiments of the instant disclosure.

DETAILED DESCRIPTION

Figure 1:
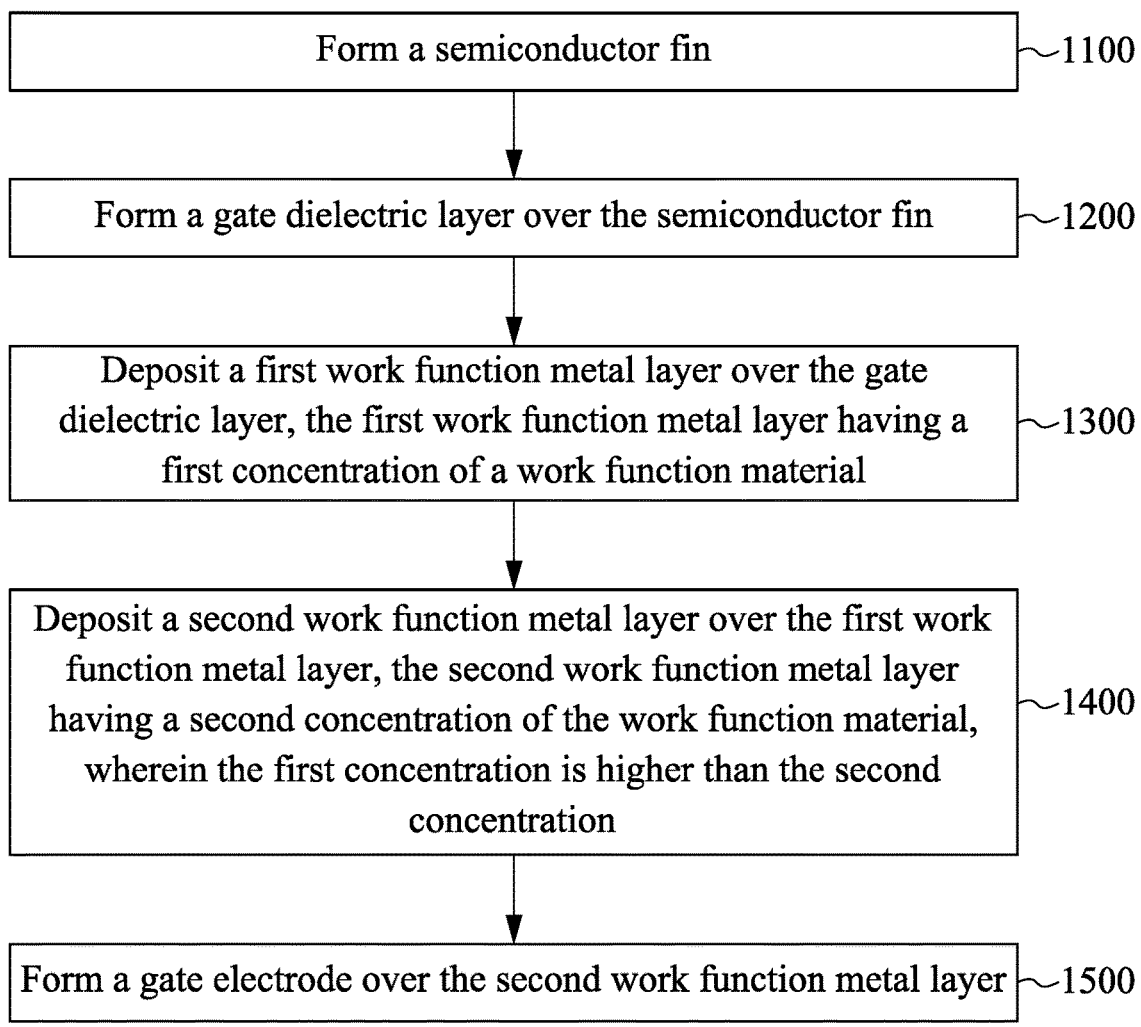
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Reference is made to FIG. 1, a flow chart of a method 1000 of fabricating a semiconductor device in accordance with some embodiments of the instant disclosure. The method 1000 begins with operation 1100 in which a semiconductor fin is formed. The method 1000 continues with operation 1200 in which a gate dielectric layer is formed over the semiconductor fin. Subsequently, operation 1300 is performed. A first work function metal layer is deposited over the gate dielectric layer. The first work function metal layer has a first concentration of a work function material. The method 1000 continues with operation 1400 in which a second work function metal layer is deposited over the first work function metal layer. The second work function metal layer has a second concentration of the work function material. The first concentration is higher than the second concentration. The method 1000 continues with operation 1500 in which a gate electrode is formed over the second work function metal layer. The discussion that follows illustrates embodiments of semiconductor devices that can be fabricated according to the method 1000 of FIG. 1. While method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
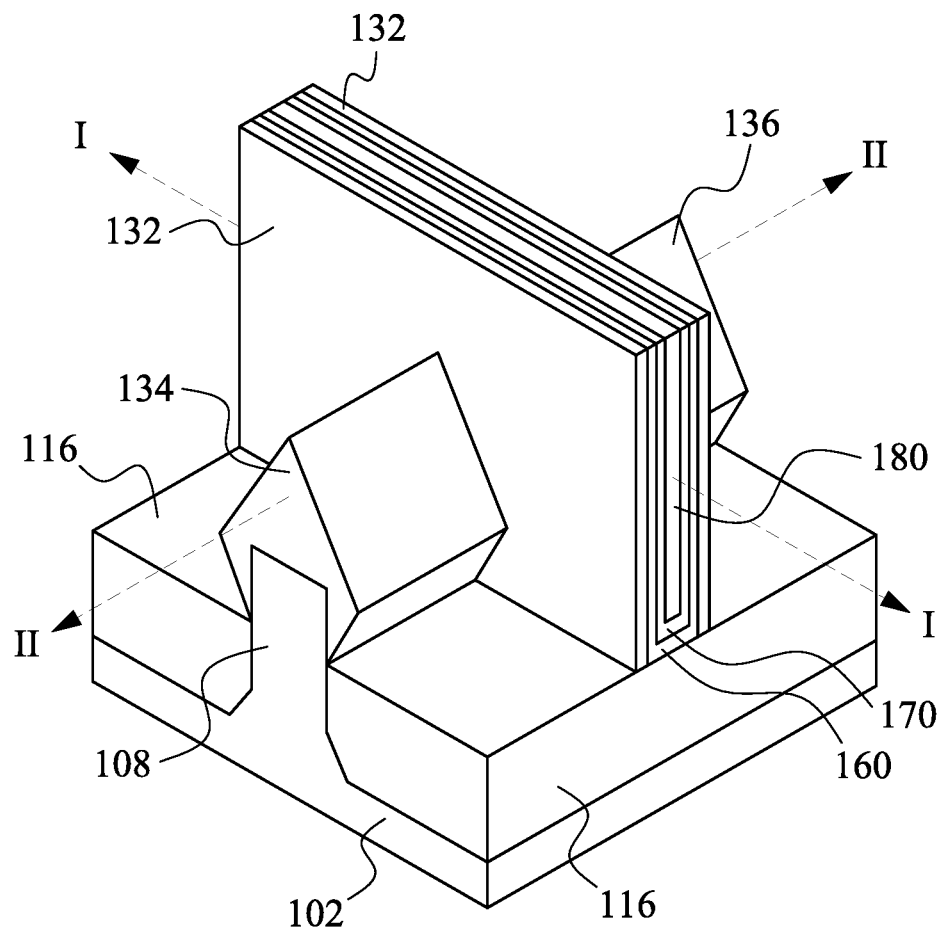
FIG. 2 is a Fin Field-Effect Transistor (finFET) in a three-dimensional view.

Reference is made to FIG. 2, illustrating a fin field-effect transistor (finFET) 100 in a three-dimensional view. The finFET 100 includes a fin 108 over a substrate 102. Isolation structures 116 are formed in the substrate 102, and the fin 108 protrudes above and from between neighbouring isolation structures 116. A gate dielectric layer 160 is disposed along sidewalls of the fin 108 and over top surfaces of the fin 108 and the isolation structures 116. A work function metal layer 170 and a conductive gate electrode 180 are disposed over the gate dielectric layer 160. A portion of the fin 108 covered by the gate dielectric layer 160, the work function metal layer 170, and the gate electrode 180 may be referred to as a channel region of the finFET 100. Source and drain regions 134 and 136 are disposed on opposite sides of the fin 108 with respect to the gate dielectric layer 160, the work function metal layer 170, and the gate electrode 180. FIG. 2 further illustrates reference cross-sections that are used in later figures. Line I-I shown in FIG. 2 is across the channel region, the gate dielectric layer 160, the work function metal layer 170, and the gate electrode 180 of the finFET 100. Line II-II shown in FIG. 2 is perpendicular to the line I-I and is along a longitudinal axis of the fin 108 and in a direction of, for example, a current flow between the source and drain regions 134 and 136. Subsequent figures refer to these reference cross-sections for clarity.

Figure 17:
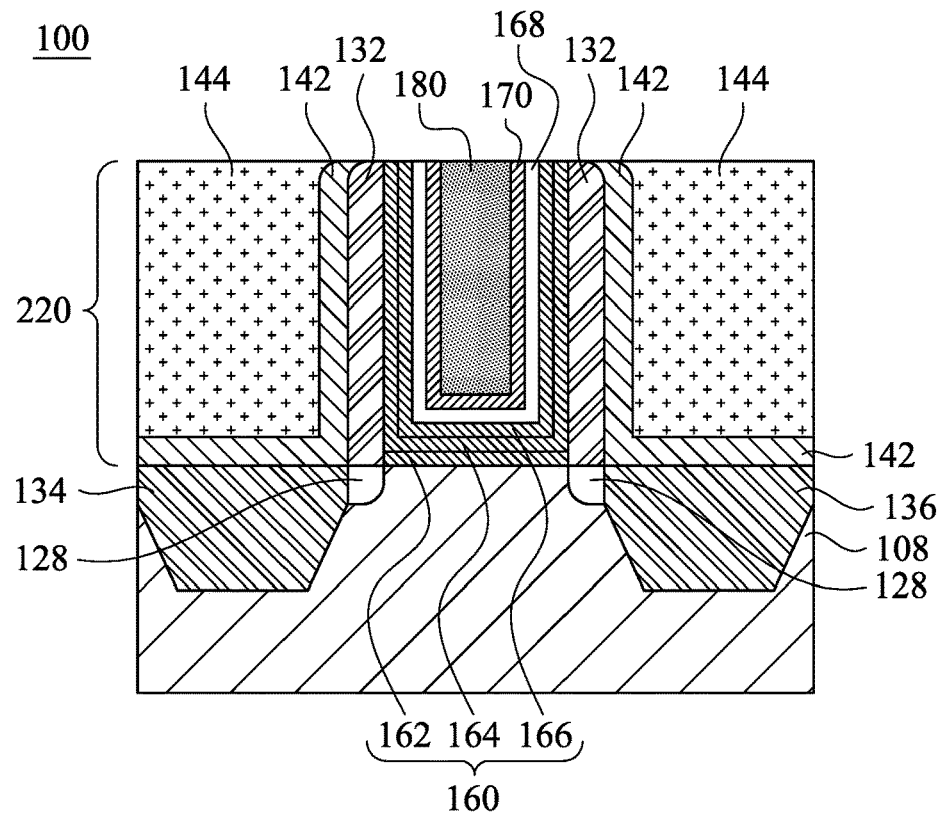
Figure 18:
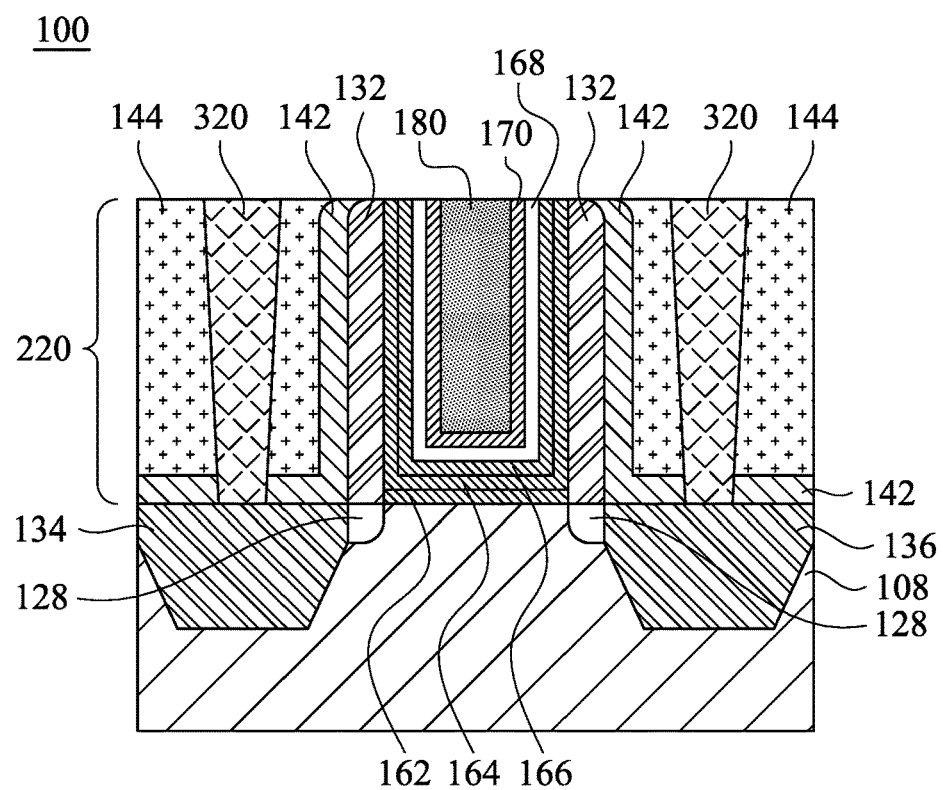

FIGS. 3 through 18 are cross-sectional views of various intermediary stages in manufacturing of finFETs in accordance with various embodiments. FIGS. 3 through 7 illustrate reference cross-sections taken along the line I-I illustrated in FIG. 2, except for multiple finFETs and/or finFETs having multiple fins. In FIGS. 8A through 16B, figures ending with an "A" designation are illustrated along a similar line I-I, and figures ending with a "B" designation are illustrated along a similar line II-II. FIGS. 17 through 18 illustrate reference cross-sections taken along the line II-II illustrated in FIG. 2.

Figure 3:
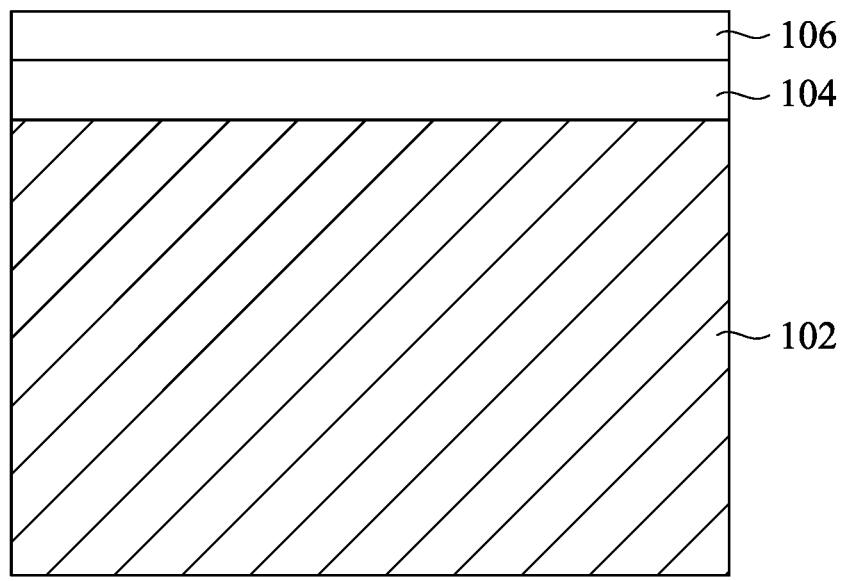
FIGS. 3 through 18 illustrate cross-sectional views of intermediary stages of the manufacturing a finFET in accordance with some embodiments of the instant disclosure.
Figure 4:
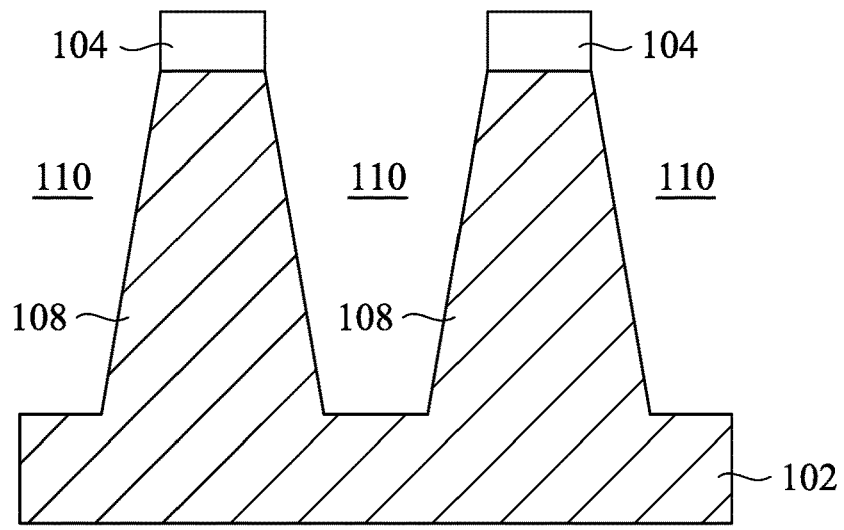

FIGS. 3 and 4 illustrate formation of semiconductor fins extending upwards from a substrate. Reference is made to FIG. 3, illustrating a wafer 100 having a semiconductor substrate 102. The semiconductor substrate 102 may be, for example, a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed over an insulator layer. The insulator layer may be, for example, a buried oxide (BOX) layer, a silicon oxide layer, or the like. The insulator layer is provided over a substrate, such as a silicon or glass substrate. Other substrates, such as a multi-layered or gradient substrate, may also be used. In some embodiments, the semiconductor material of the semiconductor substrate 102 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like.

Reference is made to FIG. 3 again. A hard mask 104 and a photoresist 106 are formed over the semiconductor substrate 102. The hard mask 104 may include one or more oxide (e.g., silicon oxide) and/or nitride (e.g., silicon nitride) layers to prevent damage to the underlying semiconductor substrate 102 during patterning. The hard mask 104 may be formed using any suitable deposition process, such as atomic layer deposition (ALD), chemical vapor deposition (CVD), high density plasma CVD (HDP-CVD), physical vapor deposition (PVD), or the like. The photoresist 106 may include any suitable photosensitive material blanket deposited using a suitable process, such as spin on coating or the like.

Reference is made to FIG. 4, illustrating patterning of the semiconductor substrate 102 to form semiconductor fins 108 between adjacent trenches 110. In some embodiments, the photoresist 106 may first be patterned by exposing the photoresist 106 to light using a photomask. Exposed or unexposed portions of the photoresist 106 may then be removed depending on whether a positive or negative resist is used.

Reference is still made to FIG. 4. The pattern of the photoresist 106 may then be transferred to the hard mask 104 (e.g., using a suitable etching process). Then, the photoresist 106 is removed from a top surface of the hard mask 104. Subsequently, the trenches 110 are patterned into the underlying substrate 102 using the hard mask 104 as a patterning mask during an etching process, for example. The etching of the substrate 102 may include a suitable etch process, such as a reactive ion etch (RIE), neutral beam etch (NBE), the like, or a combination thereof. The etching may be anisotropic. Thus, the fins 108 are formed in the wafer 100. The fins 108 extend upwards from the substrate 102 between adjacent trenches 110. In alternative embodiments (not shown), the fins 108 (or portions of the fins 108) may be epitaxially grown from the underlying substrate 102 in addition to or in lieu of patterning the substrate 102. In such embodiments, dopants of an appropriate type (e.g., p-type and/or n-type impurities) may be in-situ doped during the epitaxy.

Figure 5:
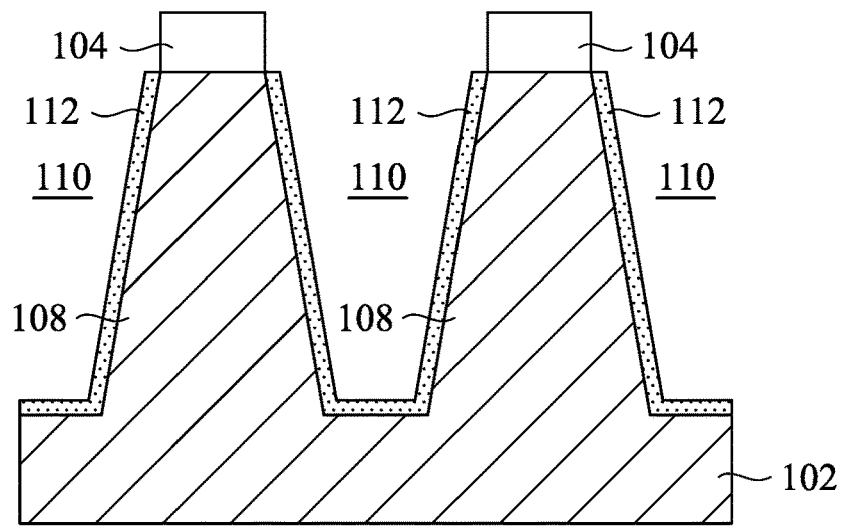
Figure 6:
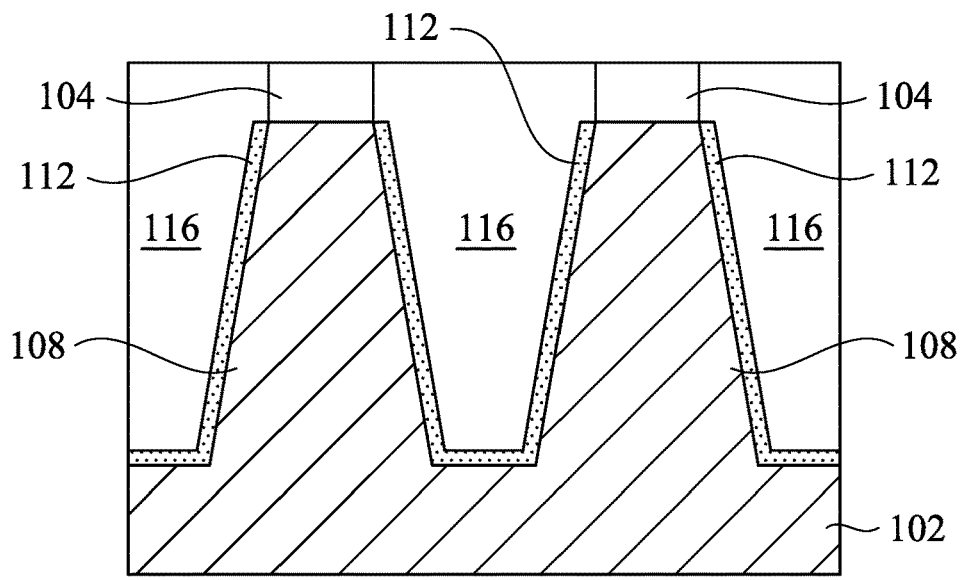

Reference is made to FIGS. 5 and 6, illustrating shallow trench isolation (STI) structures formed in the wafer 100. First, as illustrated by FIG. 5, a liner 112, such as a diffusion barrier layer, may be formed along sidewalls and bottom surfaces of the trenches 110. In some embodiments, the liner 112 may include a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner 112 may include any suitable method, such as atomic layer deposition (ALD), CVD, high density plasma (HDP) CVD, physical vapor deposition (PVD), a thermal process, or the like.

Next, as illustrated by FIG. 6, the trenches 110 may be filled with a dielectric material, such as silicon oxide, silicon nitride, silicon oxynitride, fluoride-doped silicate glass (FSG), or the like. In some embodiments, the resulting STI structures 116 may be formed using a high density plasma (HDP) CVD process, using silane ($SiH_4$) and oxygen ($O_2$) as reacting precursors. In other embodiments, the STI structures 116 may be formed using a sub-atmospheric CVD (SACVD) process or high aspect-ratio process (HARP), in which process gases may include tetraethylorthosilicate (TEOS) and ozone ($O_3$). In yet other embodiments, the STI structures 116 may be formed using a spin-on-dielectric (SOD) process with, for example, hydrogen silsesquioxane (HSQ) or methyl silsesquioxane (MSQ). An annealing process or other suitable process may be performed to cure the material of the STI structures 116, and the liner 112 may prevent (or at least reduce) the diffusion of the semiconductor material from the semiconductor fins 108 into the surrounding STI structures 116 during the annealing process. Subsequently, a chemical mechanical polish (CMP) or etch back process may be used to level top surfaces of the STI structures 116 and the hard mask 104.

Figure 7:
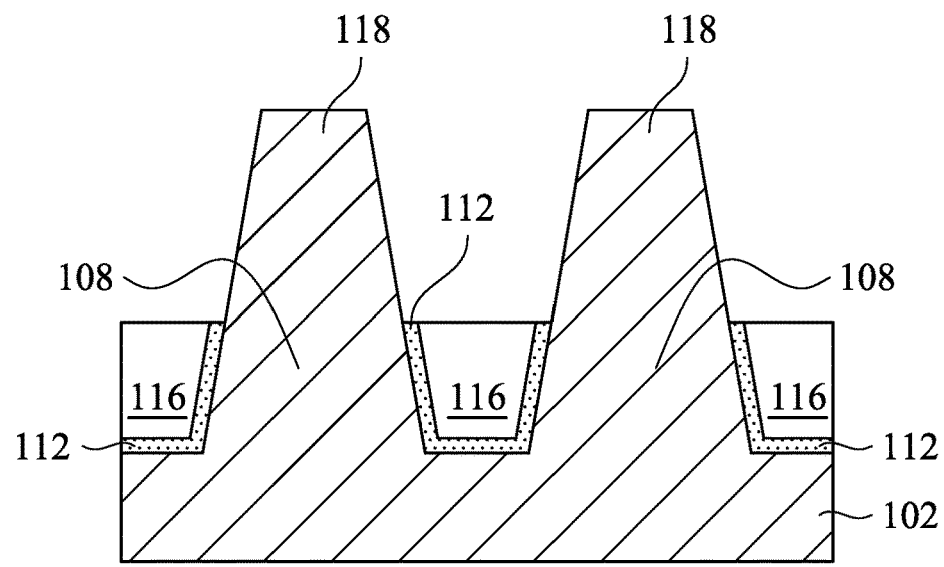

Reference is made to FIG. 7, illustrating STI structures recession. The hard mask 104 are removed, and the STI structures 116 are recessed so that top portions of the semiconductor fins 108 are higher than the top surfaces of the STI structures 116. The recessing of the STI structures 116 may include a chemical etch process, for example, using ammonia ($NH_3$) in combination with hydrofluoric acid (HF) or nitrogen trifluoride ($NF_3$) as reaction solutions either with or without plasma. The liner 112 may also be recessed to be substantially level with recessed STI structures 116. After recessing, top surfaces and portions of sidewalls of the semiconductor fins 108 are exposed. The channel regions 118 are thus formed in the semiconductor fins 108. In the completed finFET structure, a gate stack wraps around and covers sidewalls of such channel regions 118 (see e.g., FIGS. 2 and 16A).

Figure 8A:
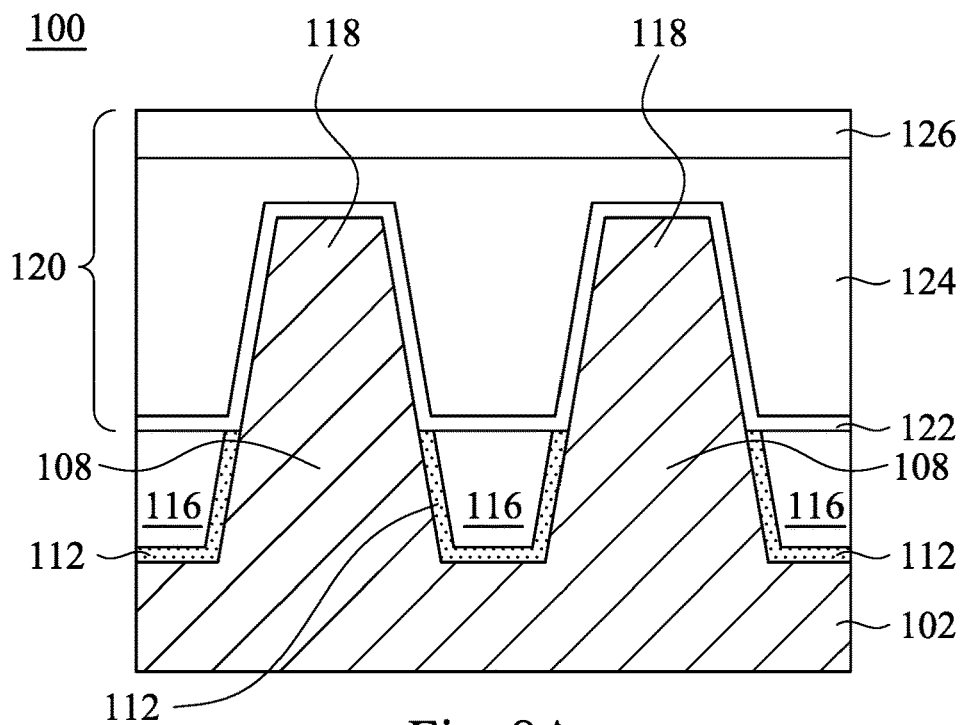
Figure 8B:
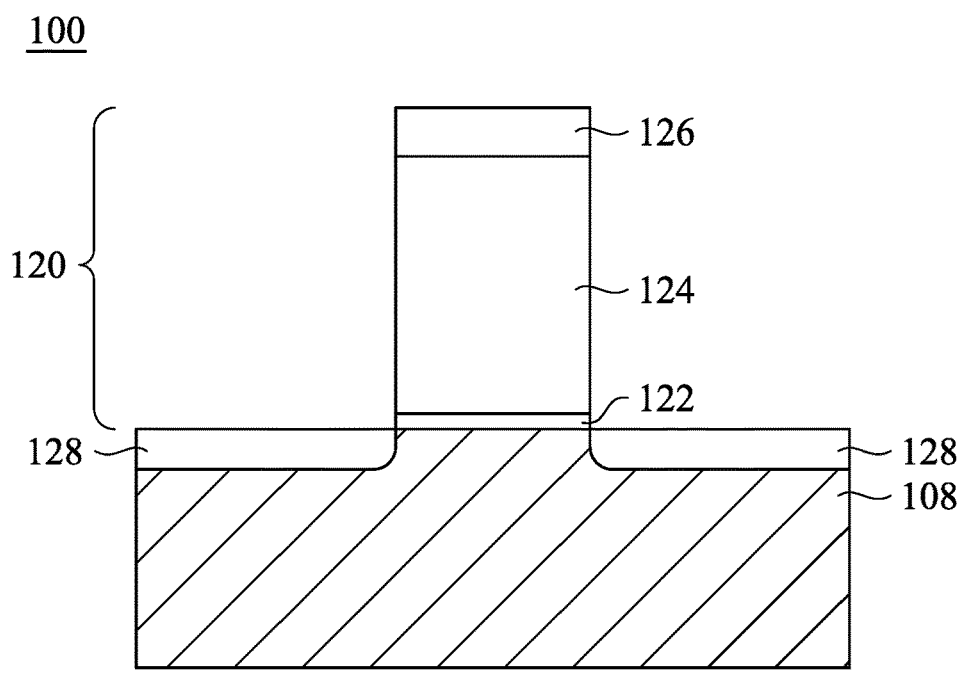

Reference is made to FIGS. 8A and 8B, illustrating formation of a dummy gate stack 120 on top surfaces and the sidewalls of the channel regions 118. The gate stack 120 includes a conformal dummy oxide 122 and a dummy gate 124 over the dummy oxide 122. The dummy gate 124 may include, for example, polysilicon. The gate stack 120 may further include a hard mask 126 over the dummy gate 124. The hard mask 126 may include silicon nitride or silicon oxide, for example. The gate stack 120 may cross over a plurality of the semiconductor fins 108 and/or the STI structures 116 in some embodiments. The gate stack 120 may also have a lengthwise direction substantially perpendicular to the lengthwise direction of the semiconductor fins 108 (see e.g., FIG. 2).

Reference is made to FIG. 8B. An ion implantation process is performed to form lightly doped drain (LDD) regions 128. The dummy gate stack 120 is used as a mask to help control the implant profile and distribution. FIG. 8B shows the LDD regions 128 formed in the semiconductor fin 108.

Figure 9A:
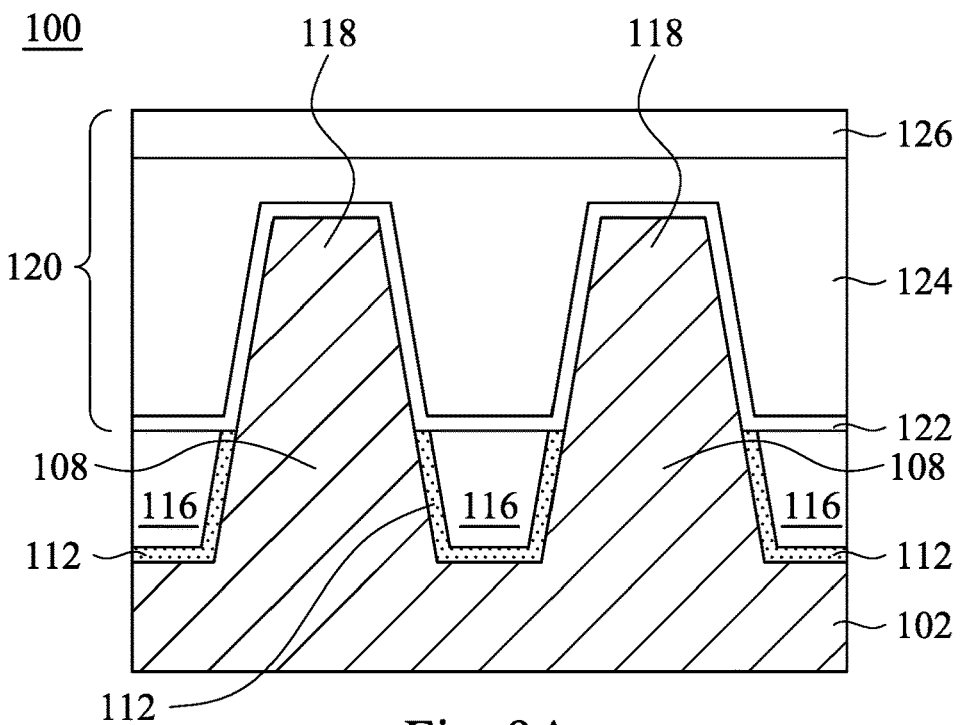
Figure 9B:
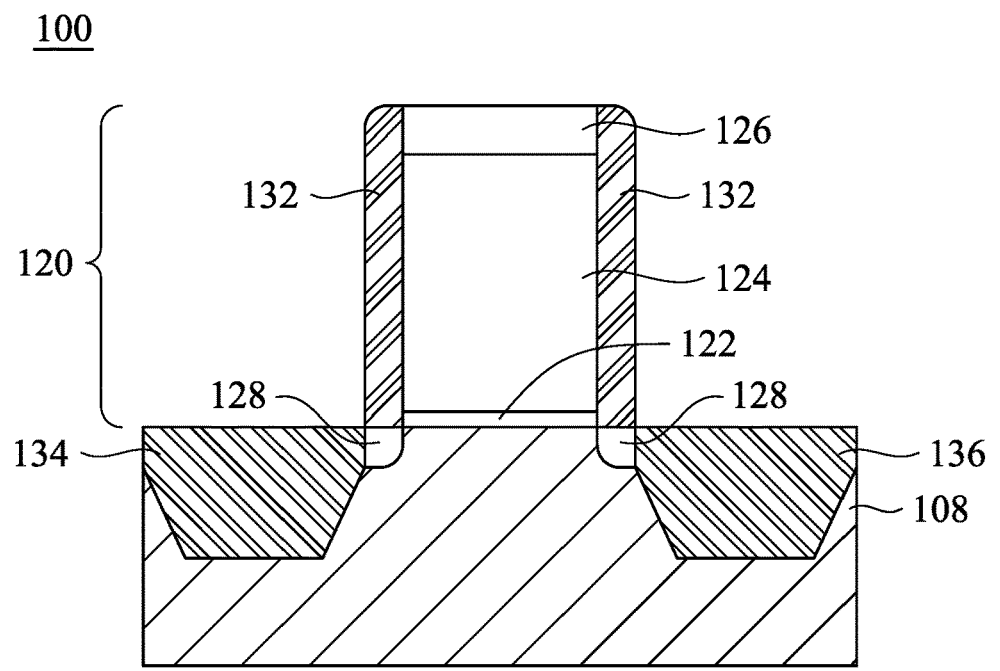

Reference is made to FIGS. 9A and 9B, illustrating formation of gate spacers and source and drain regions. Gate spacers 132 are formed on the sidewalls of the dummy gate stack 120. Source and drain regions 134 and 136 are formed in the semiconductor fins 108. In some embodiments, the gate spacers 132 are formed of silicon oxide, silicon nitride, silicon carbon nitride, or the like. Furthermore, the gate spacers 132 may have a multi-layer structure, for example, with a silicon nitride layer over a silicon oxide layer.

In some embodiments, an etching is performed to etch portions of the semiconductor fins 108 that are not covered by the hard mask 126 or gate spacers 132 to form recesses. Next, epitaxy regions 134 and 136 are formed by selectively growing a semiconductor material in the recesses. In some embodiments, the epitaxy regions 134 and 136 include silicon (with no germanium), germanium (with no silicon), silicon germanium, silicon phosphorous, or the like. The hard mask 126 and the gate spacers 132 may mask areas of the wafer 100 to define an area for forming the epitaxy regions 134 and 136 (e.g., only on exposed portions of the fins 108). After recesses are filled with the epitaxy regions 134 and 136, the further epitaxial growth of the source and drain regions causes epitaxy regions 134 and 136 to expand horizontally, and facets may start to form.

After the epitaxy step, the epitaxy regions 134 and 136 may be implanted with p-type impurities (e.g., boron or $BF_2$) for P-type metal-oxide-semiconductor (PMOS) devices or n-type impurities (e.g., phosphorous or arsenic) for N-type metal-oxide-semiconductor (NMOS) devices to form source and drain regions, which are also denoted using reference numerals 134 and 136. Alternatively, the p-type or n-type impurity may be in-situ doped when the epitaxy regions 134 and 136 are grown to form source and drain regions. The source and drain regions 134 and 136 are on the opposite sides of the gate stack 120 as shown in FIG. 9B. In yet alternative embodiments, the patterning of the fin 108 and subsequent epitaxy may be omitted. In such embodiments, source and drain regions 134 and 136 may simply be disposed on opposing sides of the dummy gate stack 120.

Figure 10A:
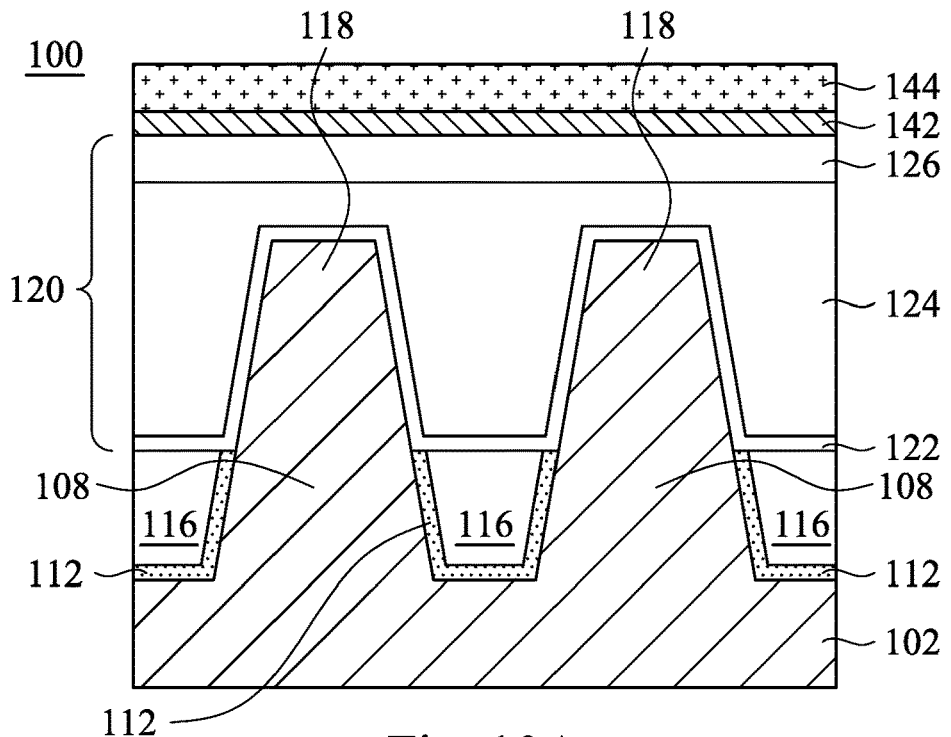
Figure 10B:
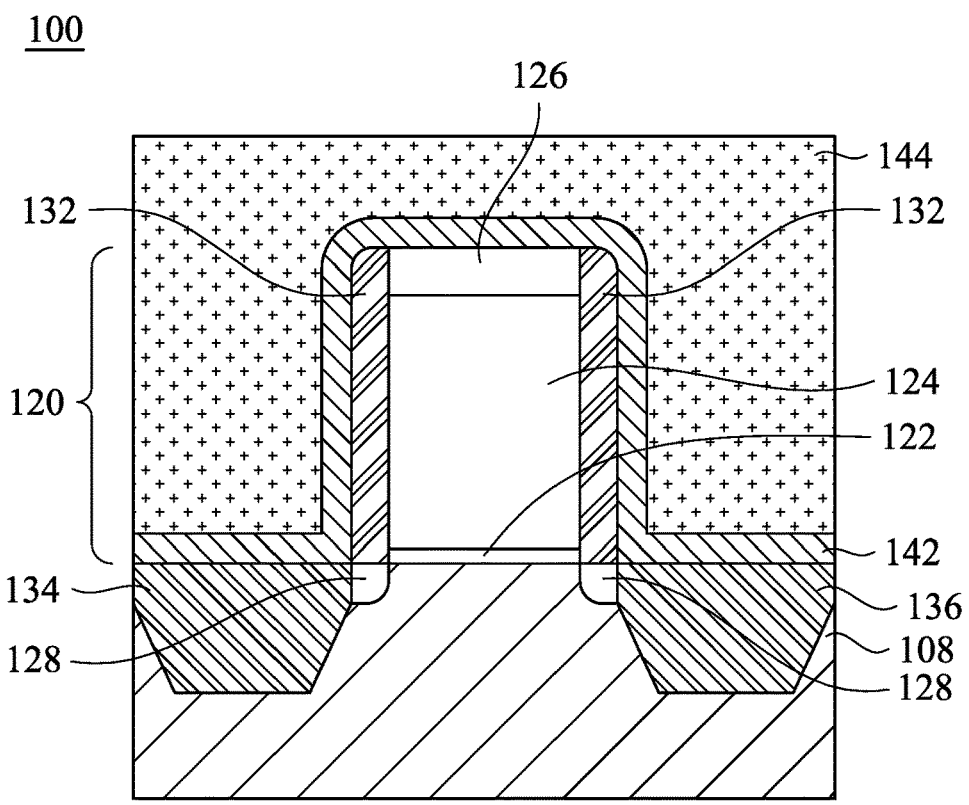

Reference is made to FIGS. 10A and 10B, illustrating contact etch stop layer and interlayer dielectric layer deposition. A contact etch stop layer (CESL) 142 is formed over the dummy gate stack 120 and the source and drain regions 134 and 136. In some embodiments, the CESL 142 includes silicon nitride, silicon carbide, or other dielectric materials. An inter-layer dielectric (ILD) layer 144 is formed over the CESL 142. The ILD layer 144 is blanket formed to a height higher than the top surface of the dummy gate stack 120. The ILD layer 144 may include flowable oxide formed using, for example, flowable chemical vapor deposition (FCVD). The ILD layer 144 may also be a spin-on glass formed using spin-on coating. For example, the ILD layer 144 may include phospho-silicate glass (PSG), boro-silicate glass (BSG), boron-doped phospho-silicate glass (BPSG), tetraethyl orthosilicate (TEOS) oxide, TiN, SiOC, or other dielectric materials.

Figure 11A:
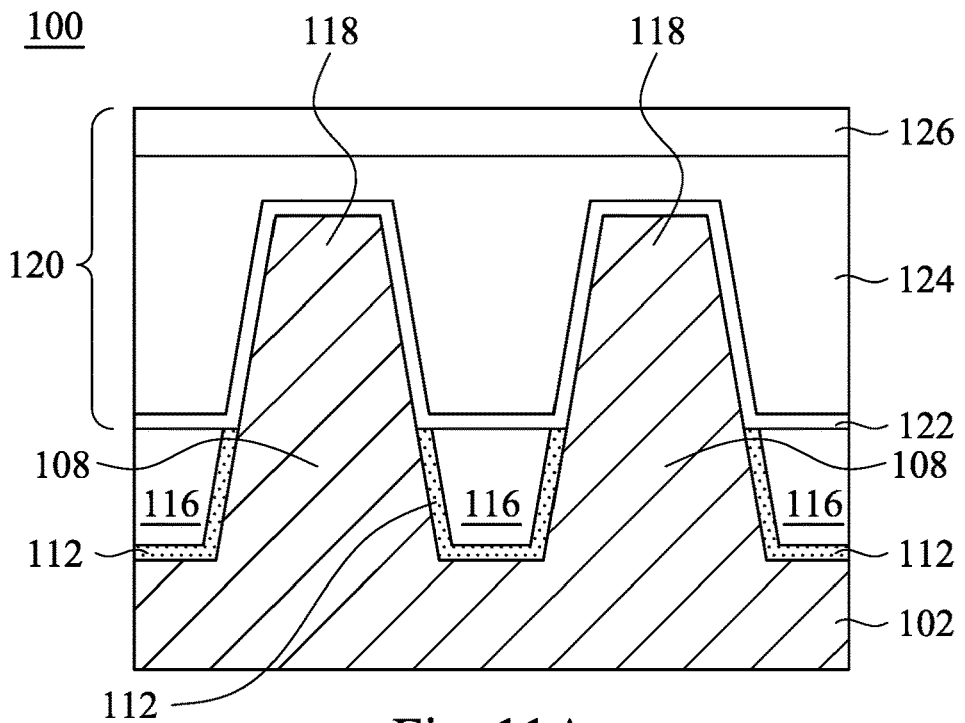
Figure 11B:
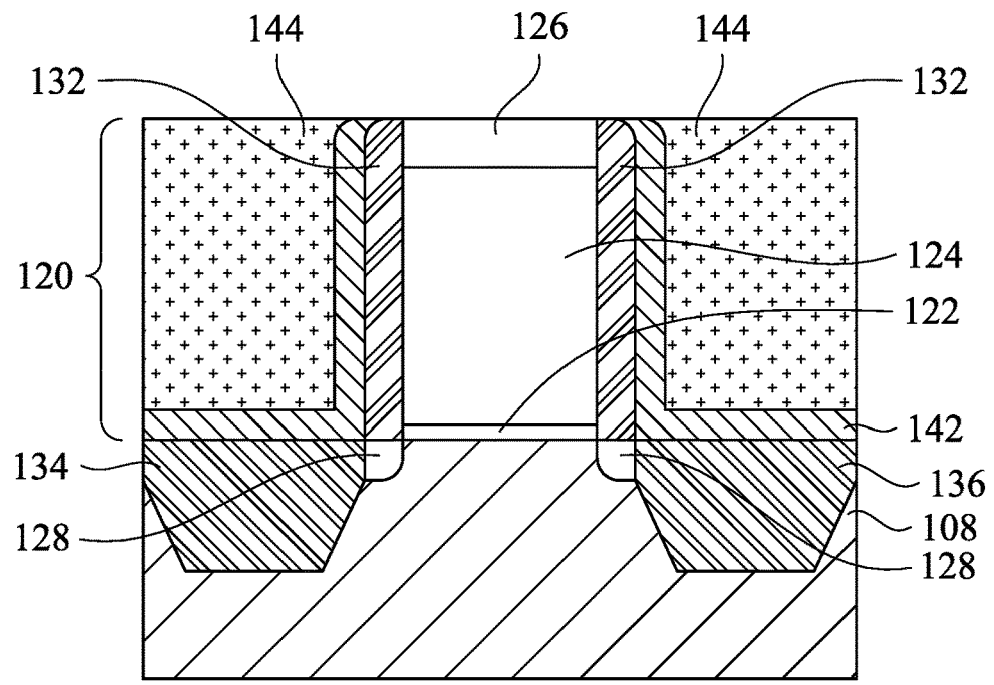

Reference is made to FIGS. 11A and 11B, illustrating a planarization process. The planarization process may be, for example, chemical mechanical polish (CMP). The CMP is performed to remove excess portions of the ILD layer 144 and the CESL 142. Then the excess portions of the ILD layer 144 and the CESL 142 are no longer over the top surface of the hard mask 126. Accordingly, the dummy gate stack 120 is exposed. In alternative embodiments, the hard mask 126 is removed during the CMP, wherein the CMP stops on the top surface of the dummy gate 124.

Figure 12A:
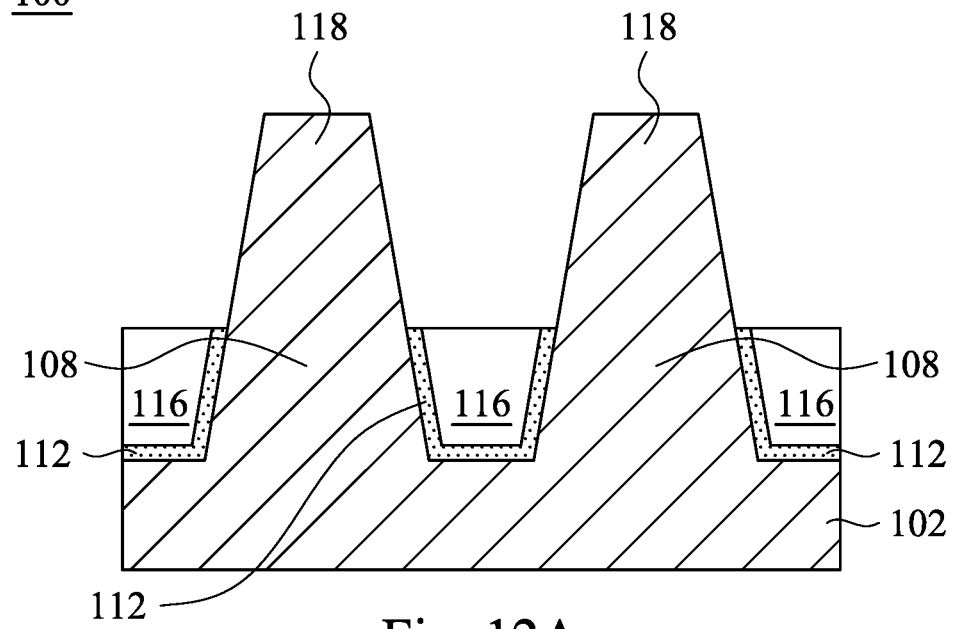
Figure 12B:
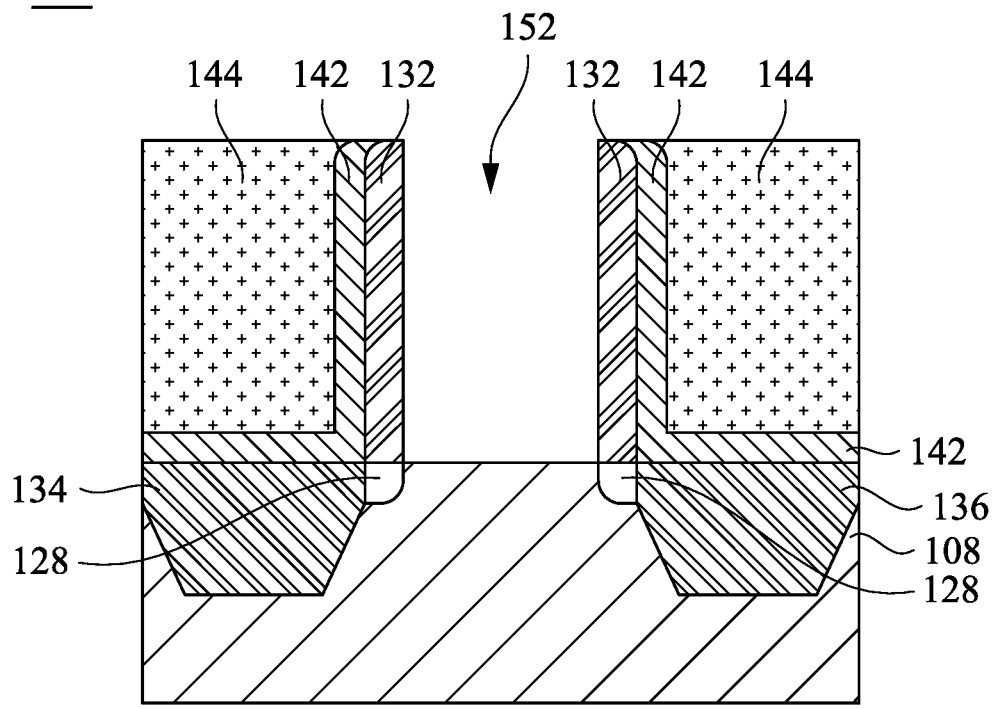

Reference is made to FIGS. 12A and 12B, illustrating removal of the dummy gate stack. A recess 152 is formed as a result of the removal of the dummy gate stack 120 as shown in FIG. 12B.

Figure 13A:
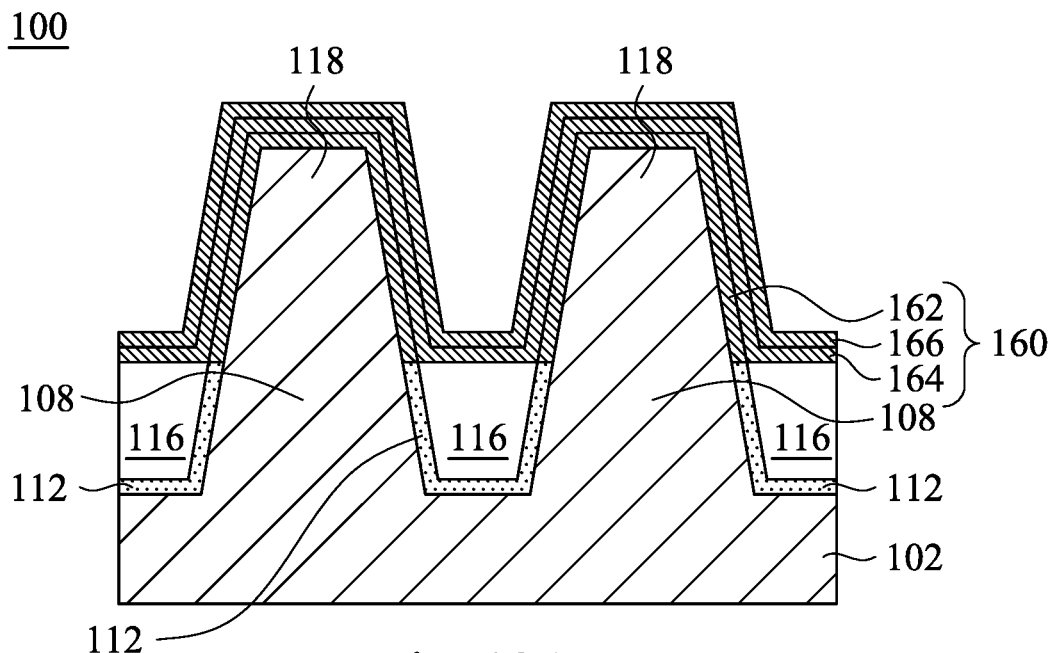
Figure 13B:
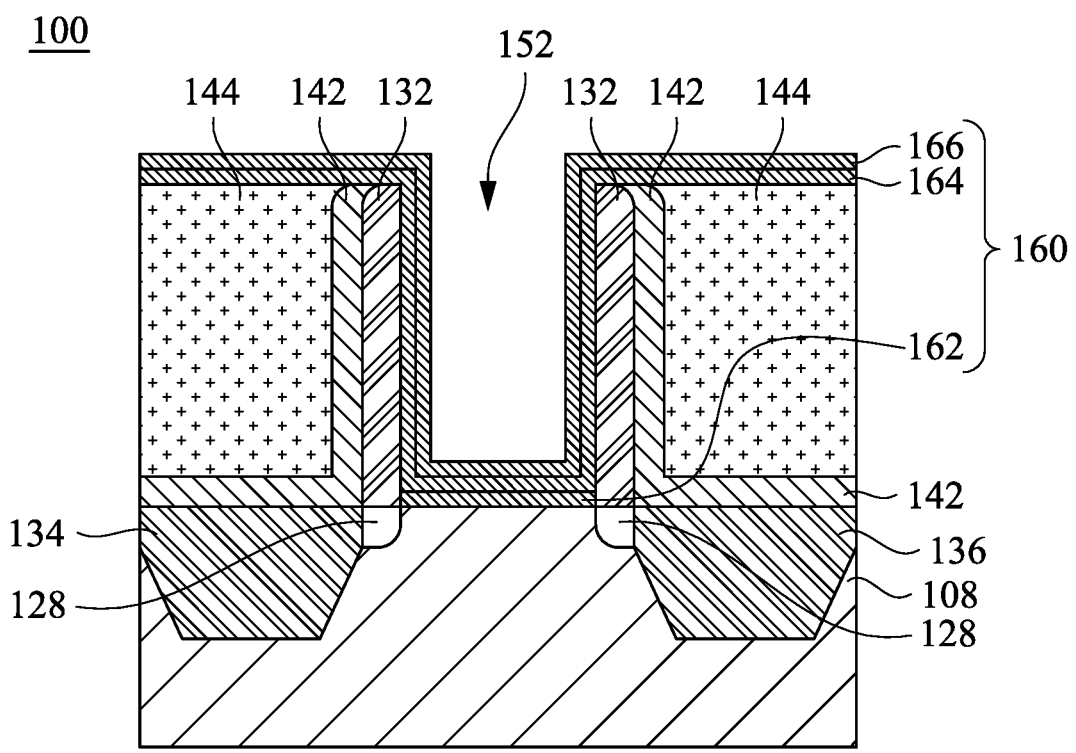

FIGS. 13A through 17 illustrate formation of a replacement gate stack. Reference is made to FIGS. 13A and 13B. An interfacial layer 162 is formed over the channel region 118 as the foundation for the following high-k dielectric layer 164. In some embodiments, the interfacial layer 162 includes an oxide layer, such as a silicon oxide layer, which may be formed through thermal oxidation or chemical oxidation of the semiconductor fins 108 or a deposition process. Next, the high-k dielectric layer 164 is formed over the interfacial layer 162. The high-k dielectric layer 164 may include a high-k dielectric material such as hafnium oxide, lanthanum oxide, aluminum oxide, or the like. The dielectric constant (k-value) of the high-k dielectric material is higher than about 3.9, and may be higher than about 7, and sometimes as high as about 21 or higher. The high-k dielectric layer 164 is overlying the interfacial layer 162. In some embodiments, a high-k dielectric cap layer 166 is formed over the high-k dielectric layer 164 as shown in FIGS. 13A and 13B. In some embodiments, the high-k dielectric cap layer 166 may be omitted.

Figure 14A:
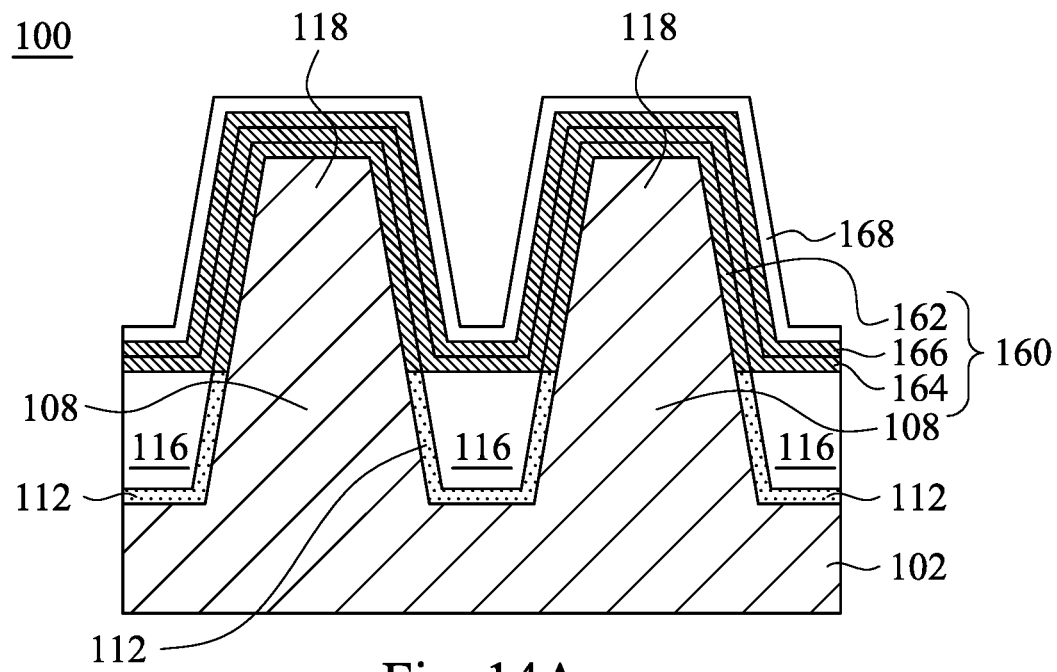
Figure 14B:
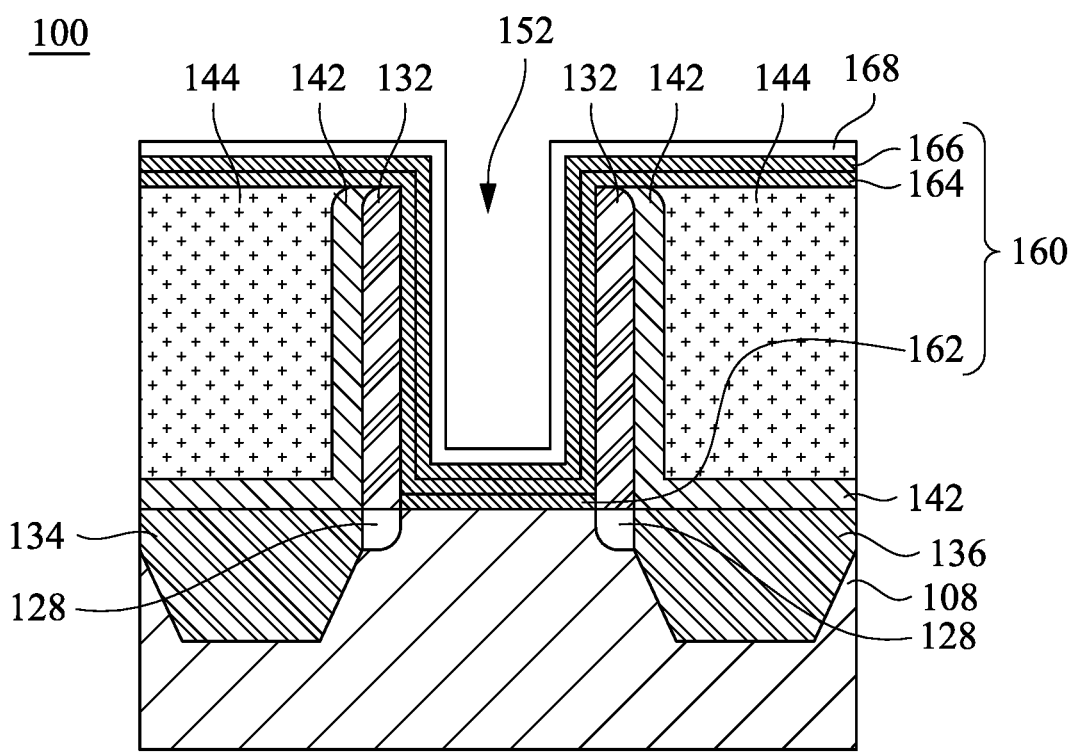

Reference is made to FIGS. 14A and 14B, illustrating formation of a metal layer. In some embodiments in which the resulting metal-oxide-semiconductor (MOS) device 100 (see FIG. 18) is an NMOS device, the metal layer 168 may include a p-type work function material. The p-type work function material has a vacuum work function value greater than about 4.4 eV.

Figure 15A:
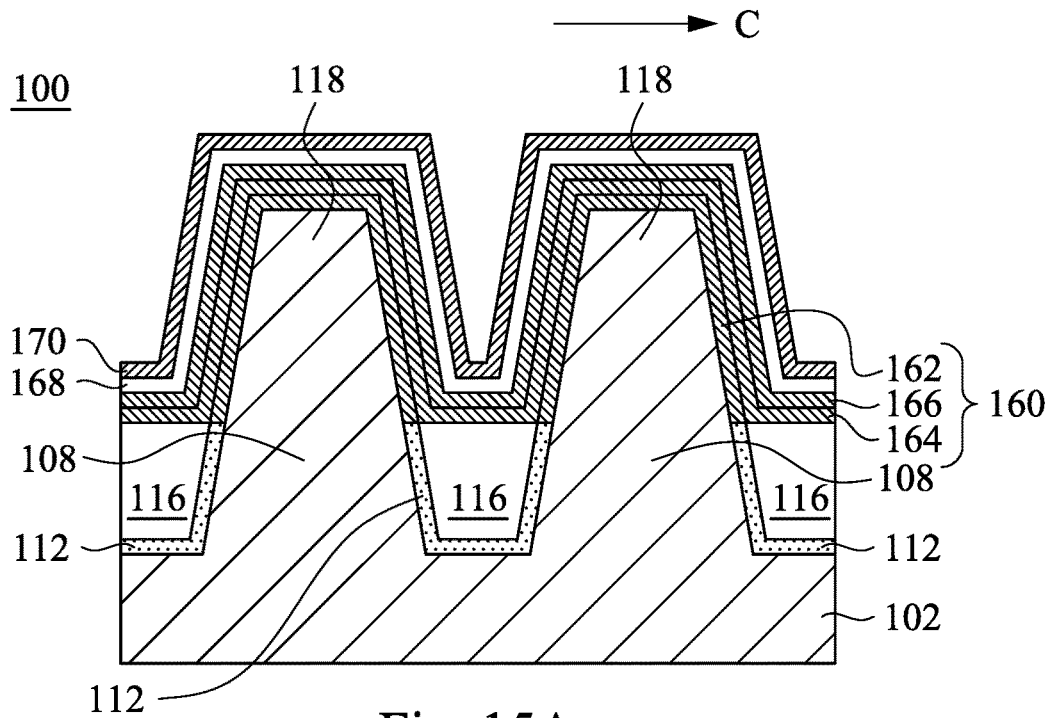
Figure 15B:
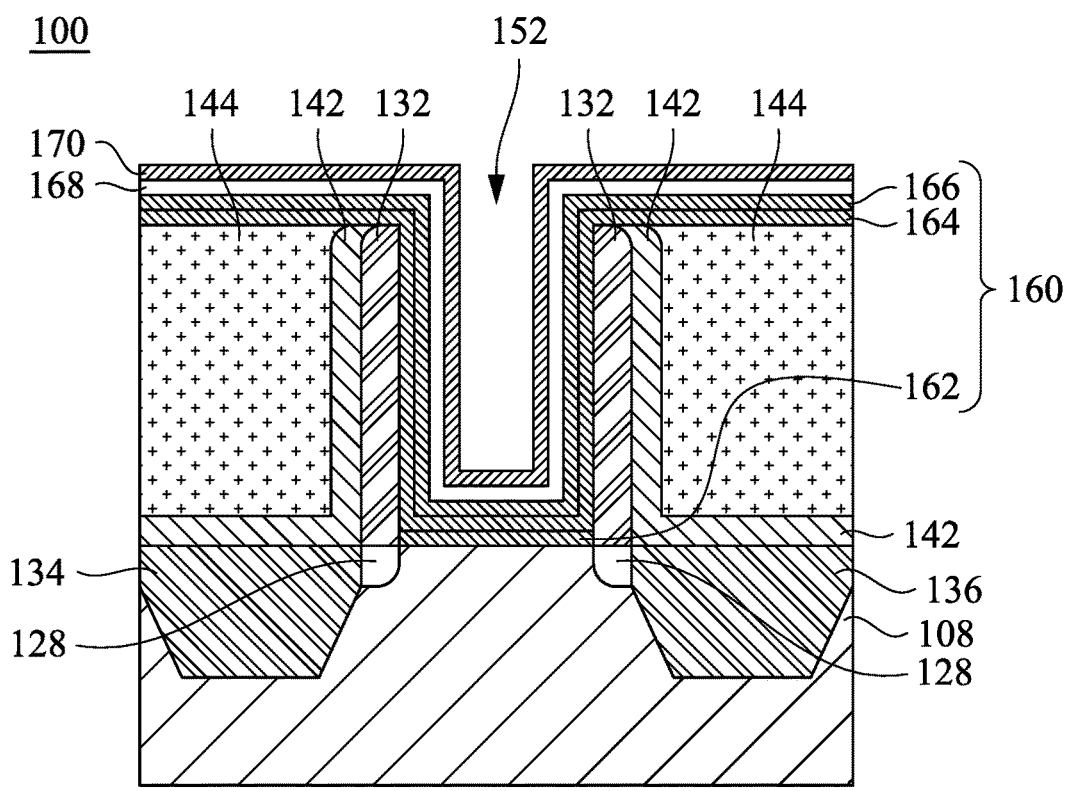

Reference is made to FIGS. 15A and 15B, illustrating formation of a work function metal layer. The work function metal layer 170 may be deposited by atomic layer deposition (ALD) or chemical vapor deposition (CVD) at a temperature ranging between about 350 and 500 degrees Celsius. ALD or CVD ensures a conformal film in the recess 152 and over the metal layer 168. As shown in FIG. 15A, the work function metal layer 170 conformingly covers the semiconductor fins 108 and the isolation structures 116. During the deposition of the work function metal layer 170, an n-type or p-type work function material is used and finely tuned to achieve desirable concentrations. The work function metal layer 170 may be a single layer or a multiple layer structure. The bottom portion of the work function metal layer 170 is close to the gate dielectric layer 160, and the upper portion of the work function metal layer 170 is close to a metal gate electrode (see the metal gate electrode 180 in FIGS. 16A and 16B). The concentration of the work function material is controlled such that the bottom portion of the work function metal layer 170 has a higher concentration of the work function material than the upper portion of the work function metal layer 170.

In some embodiments, the work function metal layer 170 is n-type, and the metal layer 168 is p-type. For example, aluminium (Al) is used as the n-type work function material, and Al concentration is higher at the bottom portion of the work function metal layer 170, while Al concentration at the upper portion of the work function metal layer 170 is lower than the bottom portion of the work function metal layer 170. Examples of Al-base n-type work function metal layer has a general formula as MAlX, where M may be Hf, Ti, Ta, Zr, Nb, or the like, and X may be C, N, Si, or the like. In some embodiments, silicon (Si) is used as the n-type work function material, and the Si concentration is higher at the bottom portion of the work function metal layer 170, while Si concentration at the upper portion of the work function metal layer 170 is lower than the bottom portion of the work function metal layer 170. Examples of metal silicide n-type work function metal layer has a general formula as $MSi_y$, where M may be Hf, Ti, Ta, Zr, W, La, or the like, and y stands for the ratio of silicon in the composition of any number larger than 0. Other material that has a vacuum work function value smaller than about 4.4 eV may also be used for the n-type work function material. Examples of suitable n-type work function material include, but not limited to, Ti, Ta, Hf, Zr, and combinations thereof.

In formation of the work function metal layer 170, a space (e.g., a space left by the dummy gate or between the semiconductor fins 108) for the work function metal layer 170 is very often smaller than about 40-60 angstrom (Å). That will be translated into even smaller thickness of the work function metal layer 170 to less than about 30 Å. Merging of the work function metal layer 170 at the opening of the space takes place, thereby causing different thicknesses of the work function metal layer 170 for fin-to-fin or for fin top to fin bottom. The thickness variation in the work function metal layer 170 further leads to threshold voltage ($V_t$) variation. A concentration variation of the work function material ill the work function metal layer 170 may reduce the sensitivity to the $V_t$ in terms of thickness. More specifically, the bottom portion of the work function metal layer 170 has a higher concentration of the work function material, and the upper portion of the work function metal layer 170 has a lower concentration of the work function material. In some embodiments, the bottom portion of the work function metal layer 170 is thinner than the upper portion of the work function metal layer 170. For example, a thickness of the bottom portion of the work function metal layer 170 is about ¼ of a thickness of the upper portion of the work function metal layer 170. The combination of high and low concentrations of the work function material creates a work function material gradient in the work function metal layer 170. The work function material gradient is translated into an effective work function value gradient. The bottom portion of the work function metal layer 170 has a lower (more n-type) effective work function value, while the upper portion of the work function metal layer 170 has a higher (less n-type) effective work function value. The bottom portion of the work function metal layer 170 ensures the effective work function in terms of device requirement, while the upper portion of the work function metal layer 170 attenuates V, fluctuation because the upper portion is low in concentration of the work function material and has a flatter (less sensitive) voltage-to-thickness sensitivity.

Reference is made to FIGS. 20A through 20C, illustrating work function metal layers 170a, 170b and 170c. The concentration of the work function material at the bottom portion of the work function metal layer is higher than the upper portion of the work function metal layer. For example, as shown in FIG. 20A, the concentration of the work function material at the bottom portion 1720 of the work function metal layer 170a may be at least twice the concentration of the work function material at the upper portion 1722 of the work function metal layer 170a. The wider gap in concentration between the upper portion 1722 and the bottom portion 1720 of the work function metal layer 170a implies the better $V_t$ stability offered. A junction is shown between the two different concentrations of the work function material. The upper portion 1722 of the work function metal layer 170a is less n-type in comparison with the bottom portion 1720 of the work function metal layer 170a. This difference in concentration of the work function material ensures a lower voltage-to-thickness sensitivity in the upper portion 1722 of the work function metal layer 170a which is low in concentration of the work function material. The work function metal layer 170a may be a bi-layer work function metal layer. The recipe for making the bottom portion 1720 and the upper portion 1722 of the work function metal layer 170a may be similar but different in the work function material ratio. In some embodiments, the recipe for making the bottom portion 1720 and the upper portion 1722 of the work function metal layer 170a may be different, while the different recipes still produce high n-type concentration at the bottom portion 1720 of the work function metal layer 170a and low n-type concentration at the upper portion 1722 of the work function metal layer 170a.

Reference is made to FIG. 20B. The work function material gradient is more complicated than that shown in FIG. 20A. The bottom portion (layer) 1730 of the work function metal layer 170b has a concentration of the work function material higher than the middle portion (layer) 1732 and the upper portion (layer) 1734 of the work function metal layer 170*b*. The middle portion 1732 of the work function metal layer 170*b* has a higher concentration of the work function material than the upper portion 1734 of the work function metal layer 170*b*. The bottom portion 1730 of the work function metal layer 170*b* is proximate to the gate dielectric layer 160 (see FIG. 15B), and the upper portion 1734 of the work function metal layer 170*b* is proximate to the metal gate electrode. The concentration of the work function material reduces toward the metal gate electrode direction (the metal gate electrode 180; see FIGS. 16A and 16B). The concentration of the work function material in each portion is controlled during ALD deposition of the work function metal layer 170*b*. In some embodiments, the work function material is an n-type material, the upper portion 1734 of the work function metal layer 170*b* has a higher effective work function value (i.e., less n-type) than the middle portion 1732 of the work function metal layer 170*b*, and the middle portion 1732 of the work function metal layer 170*b* has a higher effective work function value (i.e., less n-type) than the bottom portion 1730 of the work function metal layer 170*b*.

Reference is made to FIG. 20C. The concentration of the work function material is finely controlled to show a relatively smooth concentration transition of the work function material. That is, the work function metal layer 170*c* has a work function material gradient gradually reducing from the bottom portion 1740 of the work function metal layer 170*c* toward the upper portion 1742 of the work function metal layer 170*c*. The concentration of the work function material may vary according to device design. The bottom portion 1740 of the work function metal layer 170*c* is the most work function material concentrated region, while the upper portion 1742 of the work function metal layer 170*c* is the least work function material concentrated region. To manufacture the work function metal layer 170*c* having the gradually varying work function material gradient, the work function metal layer 170*c* may be deposited from two or more precursors. By controlling the dosage of at least one of the precursors during the deposition, the concentration of the work function material can be changed. The transition between the bottom portion 1740 and the upper portion 1742 of the work function metal layer 170*c* is milder in comparison with the work function metal layer 170*a* shown in FIG. 20A. The work function material gradient is translated into effective work function value gradient. Therefore, the work function metal layer 170*c* has an effective work function value increasing from the bottom portion 1740 of the work function metal layer 170*c* toward the upper portion 1742 of the work function metal layer 170*c* when the work function material in the work function metal layer 170*c* is an n-type material (having a vacuum work function value smaller than about 4.4 eV).

Figure 16A:
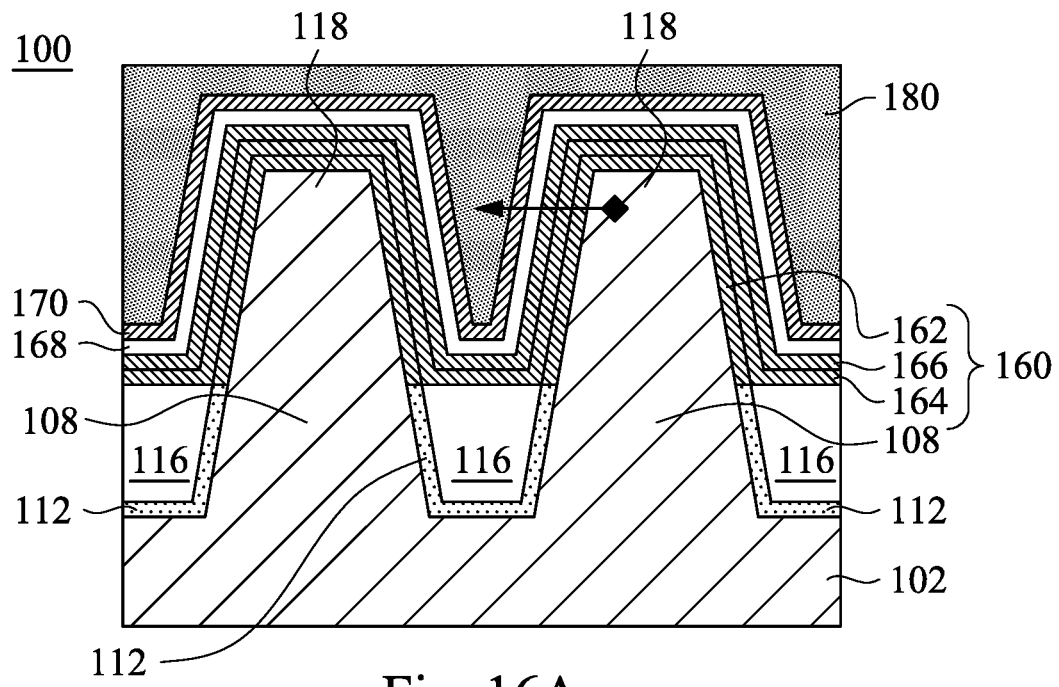
Figure 16B:
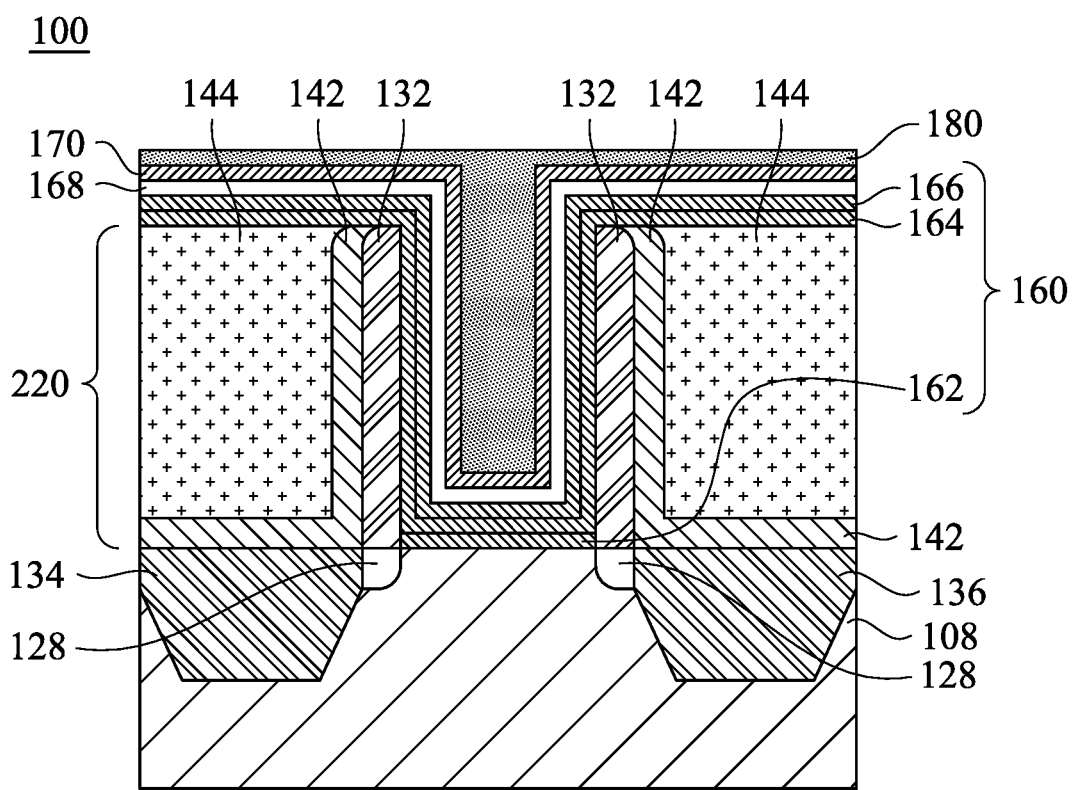

Reference is made to FIGS. 16A and 16B, illustrating deposition of the metal gate electrode. More layers are filled into the recess 152, and the resulting structure is shown in FIGS. 16A and 16B. In some exemplary embodiments, the metal gate electrode 180 may include a block layer, a wetting layer, and filling metal. The wetting (or blocking) layer may be a cobalt layer or a metallic (or metal nitride) layer of Ti and Ta, which may be formed using ALD or CVD. The filling metal may include tungsten, a tungsten alloy, aluminium, or an aluminum alloy, which may also be formed using PVD, CVD, or the like. In some embodiments, the deposition of the metal gate electrode 180 may be performed at a temperature lower than about 550° C. If the deposition of the metal gate electrode 180 is performed at a temperature higher than about 550° C., the work function material in the work function metal layer 170 may be redistributed, thereby affecting Vt. In some embodiments, the deposition of the metal gate electrode 180 is performed at a temperature in a range from about 250° C. to about 550° C.

Reference is made to FIG. 19, illustrating the layers overlying the channel region 118 along the arrow shown in FIG. 16A. On top of the channel region 118 is the interfacial layer 162, the high-k dielectric layer 164 overlies the interfacial layer 162, and the high-k dielectric cap layer 166 is disposed on the high-k dielectric layer 164. The interfacial layer 162, the high-k dielectric layer 164, and the high-k dielectric cap layer 166 form the gate dielectric layer 160. Over the gate dielectric layer 160 is the metal layer 168, which may include one or more layers. The work function metal layer 170 is disposed on the metal layer 168, followed by the metal gate electrode 180. These layers are the main body of the gate stack, and they occupy a great volume between the semiconductor fins 108 as shown in FIG. 16A. The space between the semiconductor fins 108 is small, and the multiple layers may result in layer clogging therebetween. Because the upper portion of the work function metal layer 170 has a lower concentration of the work function material and is thicker than the bottom portion of the work function metal layer 170, the upper portion of the work function metal layer 170 serves as a buffer zone that minimizes $V_t$ fluctuation.

Reference is made to FIG. 17, illustrating a planarization process. The planarization process may be, for example, a CMP for removing excess portions of the layers 180, 170, 168, and 160. The excess portions that are over the ILD layer 144 are removed, and a top surface of the ILD layer 144 is exposed. Remaining portions of the layers 180, 170, 168, and 160 form a replacement gate stack 220. Each of the remaining portions of the layers 170, 168, and 160 includes a bottom portion and sidewall portions over and connected to the bottom portion.

Reference is made to FIG. 18, illustrating formation of source and drain contacts. The formation process may include forming contact plug openings in the ILD layer 144 to expose the source and drain regions 134 and 136, forming a metal layer (not shown) to extend into the contact plug openings, performing an annealing process to form source and drain silicide regions, removing un-reacted portions of the metal layer, and filling the contact plug openings to form contact plugs 320. The MOS device 100 is thus formed.

Figure 21:
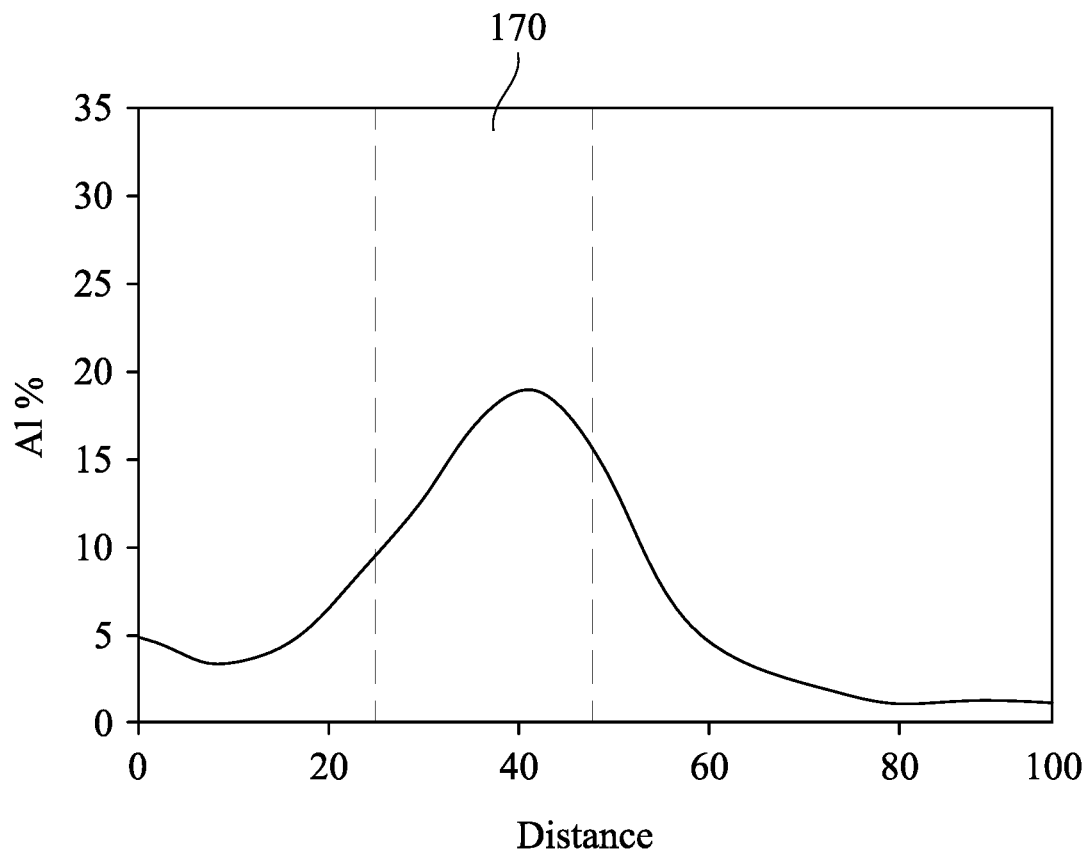
FIG. 21 is a graph showing Al % distribution in work function metal layer in accordance with some embodiments of the instant disclosure.

Reference is made to FIG. 21, illustrating a graph plotting distance against Al %. An increase in distance corresponds to an increase in nearness (proximity, propinquity) to the channel. The region between two dotted lines marks the work function metal layer 170. The thickness of the work function metal layer 170 is approximately 25 to 30 Å, and a peak in Al % can be seen at the work function metal layer 170. Due to the work function material gradient, the peak is contributed by the bottom portion of the work function metal layer 170, and the tails are from the upper portion of the work function metal layer 170. The peak is conspicuous in the curve with less fluctuation and no plateau or shoulder region. This pronounced spike arises from at least a portion of the work function metal layer 170 that has a concentration of the work function material reducing in a direction from the gate dielectric layer toward the gate electrode. In the case of an n-type channel, the effective work function value increases in that direction from the gate dielectric layer toward the gate electrode. The Al % can be translated into the effective work function value, and the combination of high and low concentration of the work function material in the work function metal layer 170 therefore minimizes $V_t$ fluctuation and achieves desirable effective work function.

The work function metal layer has different effective work functions at different portions. The combination of high and low effective work functions of the same type in one work function metal layer can minimize the $V_t$ fluctuation and achieves desirable effective work function.

In some embodiments of the present disclosure, a method includes forming a semiconductor fin; forming a gate dielectric layer over the semiconductor fin; depositing a first work function metal layer over the gate dielectric, layer, the first work function metal layer having a first concentration of a work function material; depositing a second work function metal layer over the first work function metal layer, the second work function metal layer having a second concentration of the work function material, wherein the first concentration is higher than the second concentration; and forming a gate electrode over the second work function metal layer.

In some embodiments of the present disclosure, a method includes forming a semiconductor fin over a substrate; forming a dummy gate structure over the semiconductor fin; forming source and drain regions in the semiconductor fin and on opposite sides of the dummy gate structure; removing the dummy gate structure to expose the semiconductor fin; forming a first work function metal layer over the semiconductor fin; forming a second work function metal layer over the first work function metal layer, the second work function metal layer comprising a bottom portion and an upper portion over the bottom portion, wherein the bottom portion has a first concentration of a work function material, the upper portion has a second concentration of the work function material, and the first concentration is at least twice the second concentration; and forming a gate electrode over the second word function metal layer.

In some embodiments of the present disclosure, a method includes forming a semiconductor fin over a substrate; forming a dummy gate structure over the semiconductor fin; forming source and drain regions in the semiconductor fin and on opposite sides of the dummy gate structure; removing the dummy gate structure to expose the semiconductor fin; forming a metal layer over the semiconductor fin; forming a work function metal layer over the metal layer; and forming a gate electrode over the word function metal layer, wherein from a first interface between the metal layer and the work function metal layer toward a second interface between the work function metal layer and the gate electrode, an aluminum concentration in the work function metal layer increases from a first non-zero value to a peak value, and then decreases from the peak value to a second non-zero value, and wherein the first and second non-zero values are lower than about 35%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor fin;
   forming a gate dielectric layer over the semiconductor fin;
   depositing a p-type work function metal layer over the gate dielectric layer;
   depositing an n-type work function metal layer over the p-type work function metal layer; and
   forming a gate electrode over the n-type work function metal layer, wherein a concentration of a work function material in the n-type work function metal layer increases from a first value to a peak value and then decreases from the peak value to a second value, and wherein the concentration of the work function material in the n-type work function metal layer at an interface of the gate electrode and the n-type work function metal layer has a first non-zero value lower than about 35%.

2. The method of claim 1, wherein the work function material has a vacuum work function value smaller than about 4.4 eV.

3. The method of claim 1, wherein forming the gate electrode is performed at a temperature in a range from about 250° C. to about 550° C.

4. The method of claim 1, further comprising:
   forming a liner lining a lower portion of a sidewall of the semiconductor fin; and
   forming an isolation structure over the liner.

5. The method of claim 4, wherein forming the gate dielectric layer comprises:
   forming an interfacial layer lining an upper portion of the sidewall of the semiconductor fin and in contact with the liner; and
   forming a high-k dielectric layer over the interfacial layer and in contact with the isolation structure.

6. The method of claim 1, wherein the concentration of the work function material in the n-type work function metal layer at an interface of the p-type work function metal layer and the n-type work function metal layer has a second non-zero value lower than about 35%.

7. The method of claim 1, wherein the gate electrode comprises tungsten.

8. The method of claim 1, wherein the n-type work function metal layer is an aluminum-containing layer and has formula as MAlX, wherein M is Hf, Ti, Ta, Zr, or Nb, and X is C or Si.

9. A method, comprising:
   forming a semiconductor fin over a substrate;
   forming a dummy gate structure over the semiconductor fin;
   forming source and drain regions in the semiconductor fin and on opposite sides of the dummy gate structure;
   removing the dummy gate structure to expose the semiconductor fin;
   forming a gate dielectric layer over the semiconductor fin;
   forming a first work function metal layer over and in contact with the gate dielectric layer;
   forming a second work function metal layer over the first work function metal layer; and
   forming a gate electrode over the second work function metal layer, wherein from a first interface between the first work function metal layer and the second work function metal layer toward a second interface between the second work function metal layer and the gate electrode, a concentration of a work function material in the work function metal layer increases from a first non-zero value to a peak value, and then decreases from the peak value to a second non-zero value, and wherein the first and second non-zero values are lower than about 35%.

10. The method of claim 9, wherein forming the gate dielectric layer comprises forming a high-k dielectric cap over the semiconductor fin, wherein the first work function metal layer is in contact with the high-k dielectric cap.

11. The method of claim 10, wherein forming the gate dielectric layer comprises forming a high-k dielectric layer over the semiconductor fin prior to forming the high-k dielectric cap.

12. The method of claim 9, wherein the second work function metal layer is formed by an atomic layer deposition process or a chemical vapor deposition process.

13. The method of claim 9, wherein the first work function metal layer has a vacuum work function value greater than about 4.4 eV, and the second work function metal layer has a vacuum work function value smaller than about 4.4 eV.

14. The method of claim 9, wherein the second work function metal layer is an aluminum-containing layer and has formula as MAlX, wherein M is Hf, Ti, Ta, Zr, or Nb, and X is C or Si.

15. The method of claim 9, wherein the work function material comprises aluminum.

16. A method, comprising:
forming a semiconductor fin over a substrate;
forming a dummy gate structure over the semiconductor fin;
forming source and drain regions in the semiconductor fin and on opposite sides of the dummy gate structure;
removing the dummy gate structure to expose the semiconductor fin;
forming a metal layer over the semiconductor fin;
forming a work function metal layer over the metal layer; and
forming a gate electrode over the work function metal layer, wherein from a first interface between the metal layer and the work function metal layer toward a second interface between the work function metal layer and the gate electrode, an aluminum concentration in the work function metal layer increases from a first non-zero value to a peak value, and then decreases from the peak value to a second non-zero value, and wherein the first and second non-zero values are lower than about 35%.

17. The method of claim 16, wherein the work function metal layer is formed at a temperature in a range from about 350° C. to about 500° C.

18. The method of claim 17, wherein the gate electrode is formed at a temperature in a range from about 250° C. to about 550° C.

19. The method of claim 16, wherein a thickness of the work function metal layer is in a range from about 25 Å to about 30 Å.

20. The method of claim 16, further comprising:
forming a liner lining a lower portion of a sidewall of the semiconductor fin;
forming an isolation structure over the liner;
forming an interfacial layer lining an upper portion of the sidewall of the semiconductor fin and in contact with the liner; and
forming a high-k dielectric layer over the interfacial layer and in contact with the isolation structure.

* * * * *